(12) United States Patent
Moore et al.

(10) Patent No.: US 7,802,929 B2
(45) Date of Patent: Sep. 28, 2010

(54) MONOLITHIC SHELL FOR AN OPTICAL ELECTRICAL DEVICE

(75) Inventors: Joshua Moore, Collingwood (CA); Gary Dean Sasser, San Jose, CA (US); Greta Light, San Mateo, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 12/246,092

(22) Filed: Oct. 6, 2008

(65) Prior Publication Data

US 2009/0092399 A1   Apr. 9, 2009

Related U.S. Application Data

(60) Provisional application No. 60/977,941, filed on Oct. 5, 2007.

(51) Int. Cl.
*G02B 6/36* (2006.01)
(52) U.S. Cl. .......................................... 385/92; 385/88
(58) Field of Classification Search ........................ None
See application file for complete search history.

(56) References Cited

U.S. PATENT DOCUMENTS

| 6,287,128 B1 | 9/2001 | Jones et al. |
| 6,350,063 B1 | 2/2002 | Gilliland et al. |
| 6,464,517 B1 | 10/2002 | Jones |
| 6,499,890 B2 | 12/2002 | Gilliland et al. |
| 6,744,963 B2 | 6/2004 | Hwang |
| 6,811,326 B2 | 11/2004 | Keeble et al. |
| 6,872,010 B1 | 3/2005 | Bianchini |
| 6,981,805 B2 | 1/2006 | Miller et al. |
| 2003/0100204 A1* | 5/2003 | Hwang ........................ 439/92 |
| 2005/0286838 A1 | 12/2005 | Oki et al. |
| 2007/0117458 A1* | 5/2007 | Winker et al. ............... 439/607 |
| 2009/0123157 A1 | 5/2009 | Moore |

FOREIGN PATENT DOCUMENTS

| JP | 2005-316475 | 11/2005 |
| JP | 2006-113455 | 4/2006 |

OTHER PUBLICATIONS

International Search Report, International Application No. PCT/US2008/0792, Mailing Date Apr. 30, 2009.
International Search Report, International Application No. PCT/US2008/078918, Mailing Date Apr. 3, 2009.

* cited by examiner

*Primary Examiner*—Tina M Wong
(74) *Attorney, Agent, or Firm*—Workman Nydegger

(57) ABSTRACT

An optoelectronic transceiver module. The optoelectronic module is a monolithic, one-piece module shell that includes a top portion, a bottom portion, a first side portion, a second side portion, and a front portion. The top portion, bottom portion, first side portion, second side portion and the front portion define a cavity configured to enclose electro-optical circuitry. In addition, the top portion and the bottom portion are configured such that the top portion is not separable from the bottom portion. Further, the front portion defines at least one of an optical transmit port or an optical receive port.

18 Claims, 10 Drawing Sheets

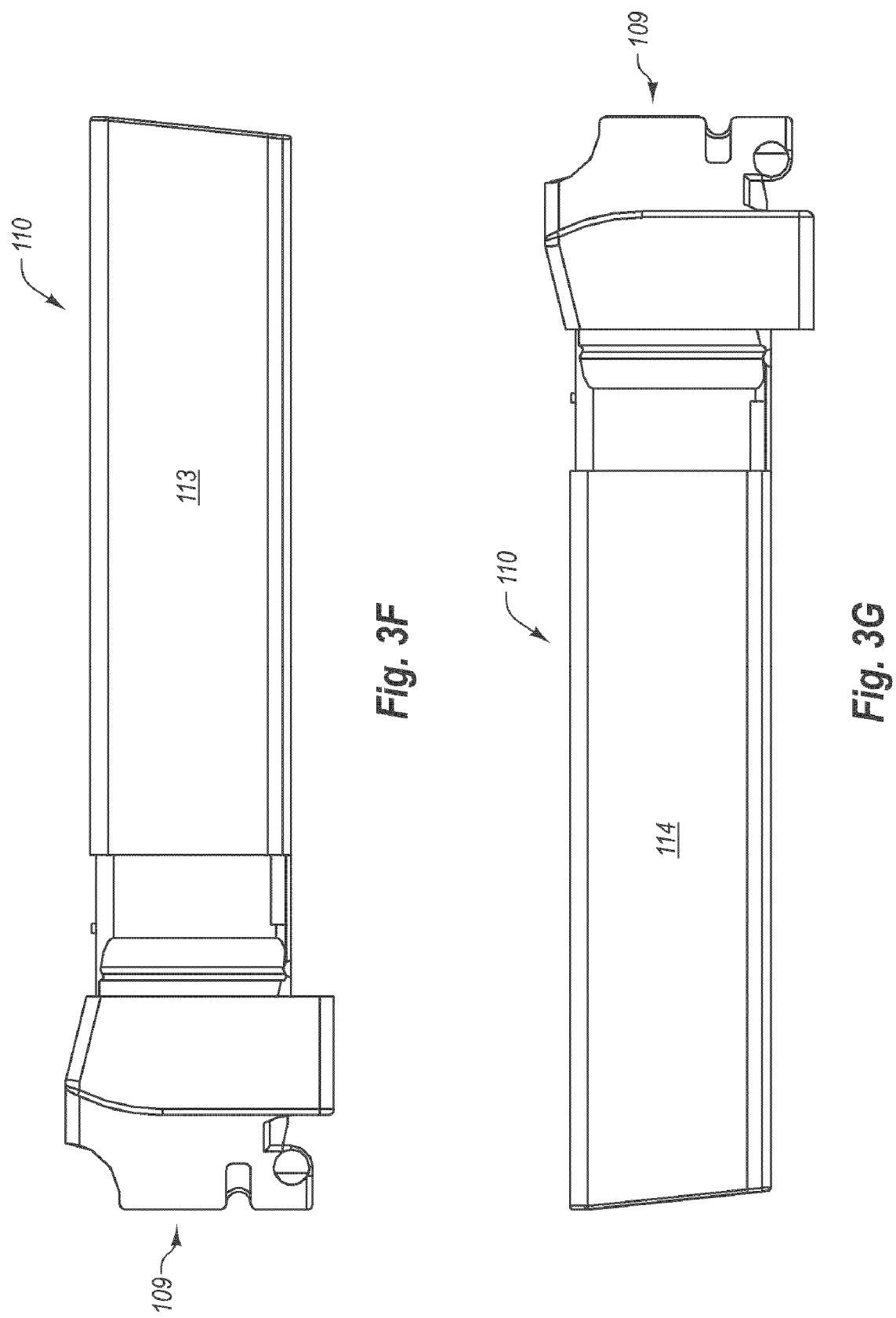

MONOLITHIC SHELL FOR AN OPTICAL ELECTRICAL DEVICE

CROSS-REFERENCE TO RELATED APPLICATIONS

This application claims the benefit of U.S. Provisional Application No. 60/977,941, filed Oct. 5, 2007, which is incorporated herein by reference in its entirety.

BACKGROUND

Electronic modules, such as electronic or optoelectronic transceiver or transponder modules, are increasingly used in electronic and optoelectronic communication. Some electronic modules can be plugged into a variety of host networking equipment. Multi-Source Agreements ("MSAs"), such as the SFF MSA, the SFP MSA, XENPAK MSA, X2 MSA and the SFP+ (IPF) MSA specify, among other things, package dimensions for electronic modules. Conformity with an MSA allows an electronic module to be plugged into host equipment designed in compliance with the MSA. Electronic modules typically communicate with a printed circuit board of a host device by transmitting electrical signals to the printed circuit board and receiving electrical signals from the printed circuit board. These electrical signals can then be transmitted by the electronic module outside the host device as optical and/or electrical signals.

One common difficulty associated with the operation of electronic modules is the generation of electromagnetic interference ("EMI"). The generation of EMI by an electronic module is a matter of significant concern because such EMI can seriously impair, if not prevent, the proper operation of other systems and devices in the vicinity. Thus, the control of EMI effects is an important consideration in the design and use of electronic modules.

However, many conventional electronic modules are comprised of a separable top shell piece and a bottom shell piece that can be mated together. The electronic components may then be placed inside the shell formed by the top and bottom pieces. While this type of configuration has proven useful, it is susceptible to EMI problems. For example, the seams created by the mating of the top and bottom shell pieces often allow EMI to leak from the module. Accordingly, it would be useful to implement a module with better EMI containment.

BRIEF SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

One embodiment disclosed herein relates to an optoelectronic transceiver module. The optoelectronic module includes a monolithic, one-piece module shell that includes a top portion, a bottom portion, a first side portion, a second side portion, and a front portion. The top portion, bottom portion, first side portion, second side portion and the front portion define a cavity configured to enclose electro-optical circuitry. In addition, the top portion and the bottom portion are configured such that the top portion is not separable from the bottom portion. Further, the front portion defines at least one of an optical transmit port or an optical receive port.

Another embodiment disclosed herein relates to an optoelectronic transceiver module. The optoelectronic module includes a monolithic, one-piece module shell that includes a top portion, a bottom portion, a first side portion, a second side portion, and a front portion. The top portion, bottom portion, first side portion, second side portion and the front portion define a cavity. The optoelectronic transceiver module also includes a printed circuit board (PCB) carrier configured to be placed in the cavity of the monolithic, one-piece module shell, wherein the PCB carrier is configured to receive a PCB having one or more optoelectronic circuits placed thereon.

Additional features and advantages will be set forth in the description which follows, and in part will be obvious from the description, or may be learned by the practice of the teaching herein. The features and advantages of the teaching herein may be realized and obtained by means of the instruments and combinations particularly pointed out in the appended claims. These and other features will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only illustrated embodiments of the invention and are therefore not to be considered limiting of its scope. The invention will be described and explained with additional specificity and detail through the use of the accompanying drawings in which:

FIGS. 3A-3G illustrate an example monolithic one piece optoelectronic transceiver shell in accordance with an embodiment of the present invention;

DETAILED DESCRIPTION

Example embodiments of the present invention relate to various mechanical systems that can be implemented in an electronic module, such as an electronic or optoelectronic transceiver or transponder module. Some electronic modules can be configured to be plugged into a variety of host equipment. Some example embodiments of the invention can help maintain electromagnetic interference ("EMI") emitted outside the host equipment at acceptably low levels.

Example Optoelectronic Transceiver Module

Reference will now be made to the drawings to describe various aspects of exemplary embodiments of the invention. It is to be understood that the drawings are diagrammatic and schematic representations of such exemplary embodiments, and are not limiting of the present invention, nor are they necessarily drawn to scale.

Figure 1:
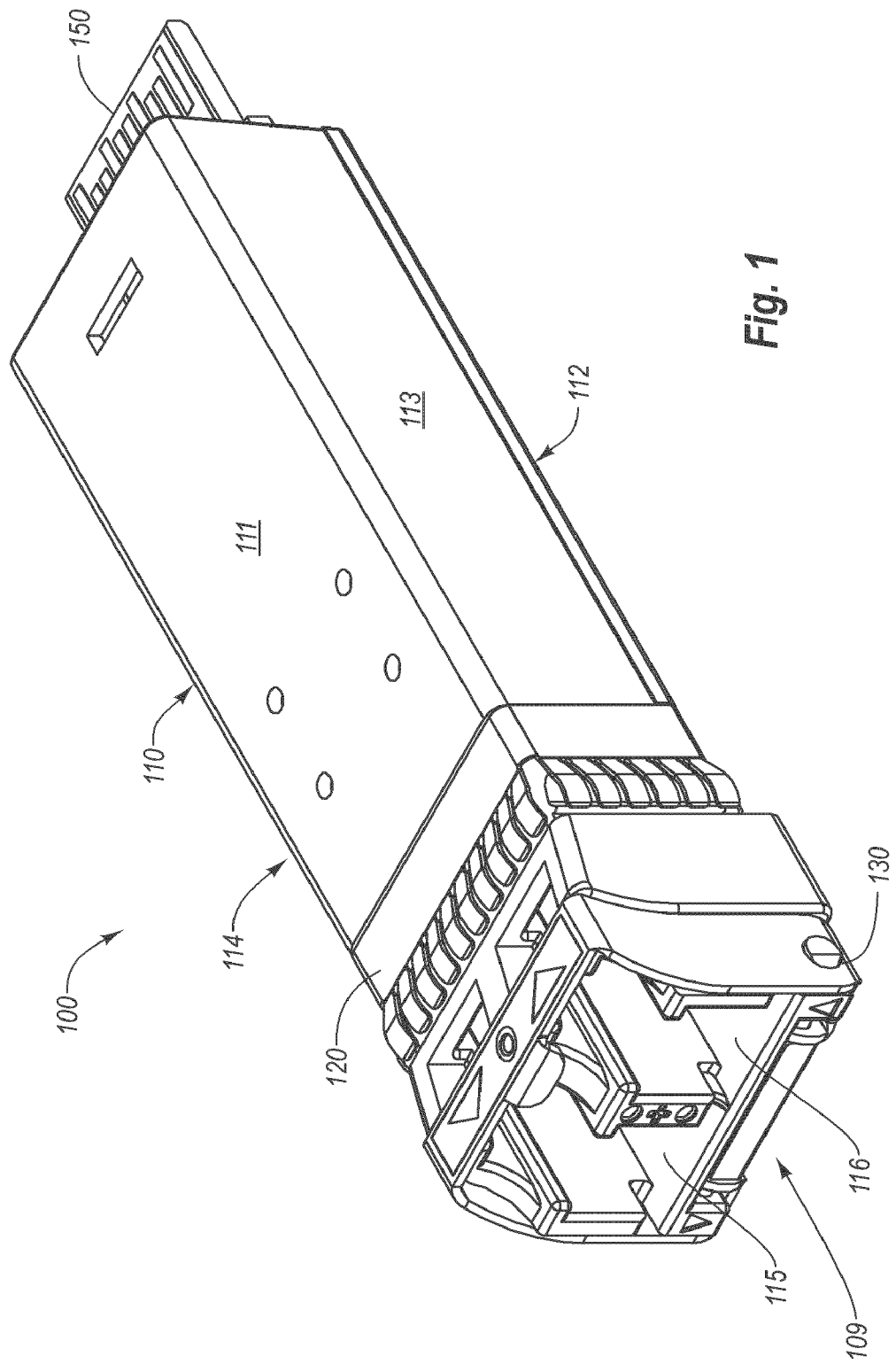
FIG. 1 illustrates an example optoelectronic transceiver module.

Reference is first made to FIG. 1, which illustrates an embodiment of an optoelectronic transceiver module 100 for use in transmitting and receiving optical signals in connection with a host device (not shown). The optoelectronic transceiver module 100 can be configured for optical signal transmission and reception at a variety of per-second data rates including, but not limited to, 1 Gbit, 2 Gbit, 2.5 Gbit, 4 Gbit, 8 Gbit, 10 Gbit, or higher. Furthermore, the optoelectronic transceiver module 100 can be configured for optical signal transmission and reception at various wavelengths including, but not limited to, 850 nm, 1310 nm, 1470 nm, 1490 nm, 1510 nm, 1530 nm, 1550 nm, 1570 nm, 1590 nm, or 1610 nm. Further, the optoelectronic transceiver module 100 can be configured to support various transmission standards including, but not limited to, Fast Ethernet, Gigabit Ethernet, 10 Gigabit Ethernet, and 1×, 2×, 4×, and 10×Fibre Channel. In addition, although one example of the optoelectronic transceiver module 100 is configured to have a form factor that is substantially compliant with the SFP+ (IPF) MSA, the optoelectronic transceiver module 100 can alternatively be configured to have a variety of different form factors that are substantially compliant with other MSAs including, but not limited to, the SFF MSA, XENPAK MSA, X2 MSA, or the SFP MSA.

As shown in FIG. 1, optoelectronic transceiver module 100 includes various components, including an optoelectronic transceiver shell 110 (hereinafter also referred to simply as shell 110) that includes a top portion 111, a bottom portion 112, a first side portion 113, a second side portion 114, and a front portion 109 that are integrated as a monolithic, one piece shell. In other words, shell 110 is one piece and does not include a separable top portion and a bottom portion that can be mated as in conventional transceiver shells.

As further shown, front portion 109 defines an optical output port 115 and an optical input port 116. Optical output port 115 is configured to house electro-optical circuitry such as a Transmit Optical Subassembly ("TOSA") when a transceiver printed circuit board ("PCB") is implemented in monolithic, one piece shell 110. Likewise, optical input port 116 is configured to house electro-optical circuitry such as a Receive Optical Subassembly ("ROSA") when a transceiver PCB is implemented in monolithic, one piece shell 110.

FIG. 1 also shows that optoelectronic transceiver module 100 includes a latch system 130 that is configured to help secure optoelectronic transceiver module 100 to a host computing device. In addition, optoelectronic transceiver module 100 includes a collar clip 120 configured to help reduce EMI when optoelectronic transceiver module 100 is connected to the host computing device.

Figure 5:
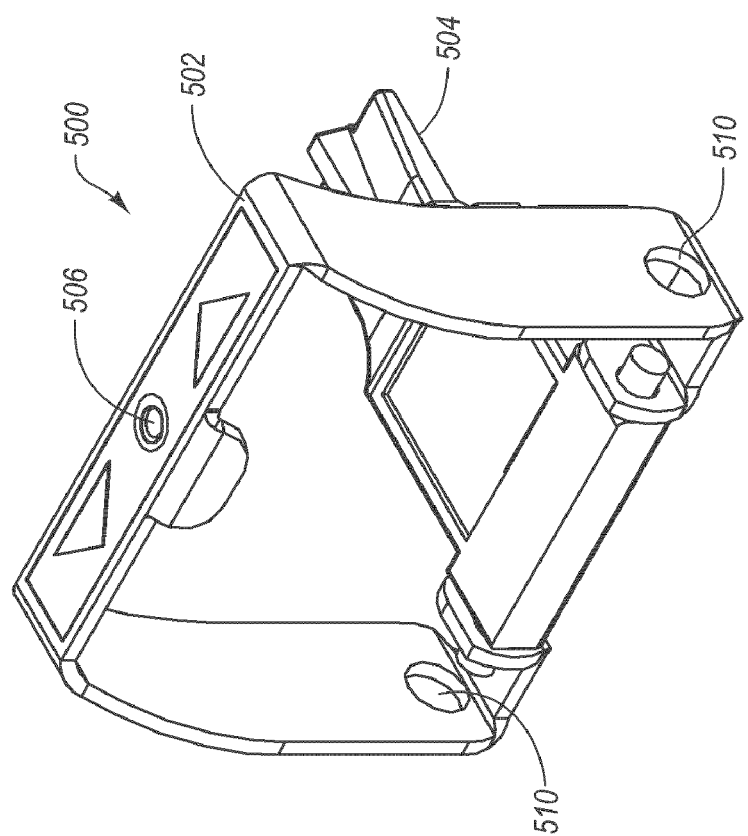
FIG. 5 illustrates aspects of an example latch system.

With reference now to FIG. 5, aspects of an example latch system 500, which corresponds to latch system 130, are disclosed. As disclosed in FIG. 5, the example latching mechanism 500 generally includes a bail 502 and a latch 504 configured to cooperate in securing and releasing the optoelectronic transceiver module 100 within a receptacle, such as a cage, of a host device (not shown).

As disclosed in FIG. 5, the bail 502 includes a dimple 506 that extends downward from the top of the bail. The monolithic, one piece shell 110 includes an indentation 105 (see FIG. 3A) that generally corresponds in size and location to the dimple 506. The bail 502 also includes holes 510 that correspond to pivot points 106 (see FIG. 3A) on the monolithic, one piece shell 110 of the optoelectronic transceiver module 100. The bail 502 can be attached to the pivot points 106 through the holes 510 to enable the bail 502 to rotate about the pivot points 106. As the bail 502 is rotated about the pivot points 106 into a vertical position, the bail 502 is configured to flex slightly so that the dimple 506 can engage or click into the indentation 105, thereby securing the bail 502 in the vertical position. The dimple 506 and the indentation 105 can thus provide tactile and audible feedback to a user as the dimple 506 seats in the indentation 105. This securement of the bail 502 in the vertical position can avoid the inadvertent release of the bail 502 from the vertical position. At the same time, a deliberate pushing or pulling of the bail 502 away from the optoelectronic transceiver module 100 by a user can result in the intentional release of the bail 502 from the vertical position.

Figure 6:
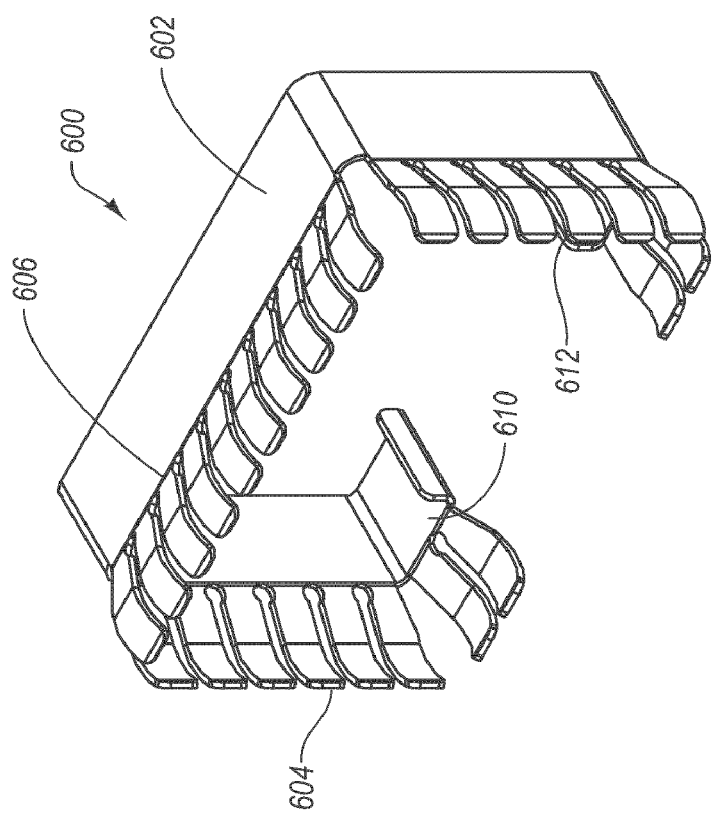
FIG. 6 illustrates aspects of example EMI collar clip.

With reference now to FIG. 6, aspects of an example collar clip 600, which corresponds to collar clip 120, are disclosed. In general, the example collar clip 600 includes a body 602 that is configured to partially surround and engage the monolithic, one piece shell 110 of the optoelectronic transceiver module 100. The collar clip 600 also includes a plurality of fingers 604 defined around an edge of the body 602. The collar clip 600 further includes a plurality of cavities 606 defined between some of the fingers 604. Each of the cavities 606 is configured to receive a corresponding post 107 (see FIG. 3A) of the monolithic, one piece shell 110 of the optoelectronic transceiver module 100.

The fingers 604 are configured to contact a cage of a host device (not shown) when the optoelectronic transceiver module 100 is inserted into the host board, thereby helping to decrease EMI emissions from the cage of the host device. In general, the number of fingers 604 can be maximized within the space and manufacturing constraints of the collar clip 600 in order to control EMI emission from the cage of the host device.

The collar clip 600 also includes a first locking flange 610 on a first end of the body 602 and a second locking flange 612 on a second end of the body 602. The first and second locking flanges 610 and 612 are configured to engage corresponding indentations defined in the monolithic, one piece shell 110.

Returning again to FIG. 1, the monolithic, one piece shell 110 can be formed using a die casting process. One example material from which the monolithic, one piece shell 110 can be die cast is zinc, although the monolithic, one piece shell 110 may alternatively be die cast from other suitable materials such as aluminum or magnesium. In addition, monolithic, one piece shell 110 may also be formed using various fabrication techniques known in the art such as investment casting, metal injection molding (MIM), and plastic injection molding, including materials such as metalized plastics and metal filled composites.

Figure 2:
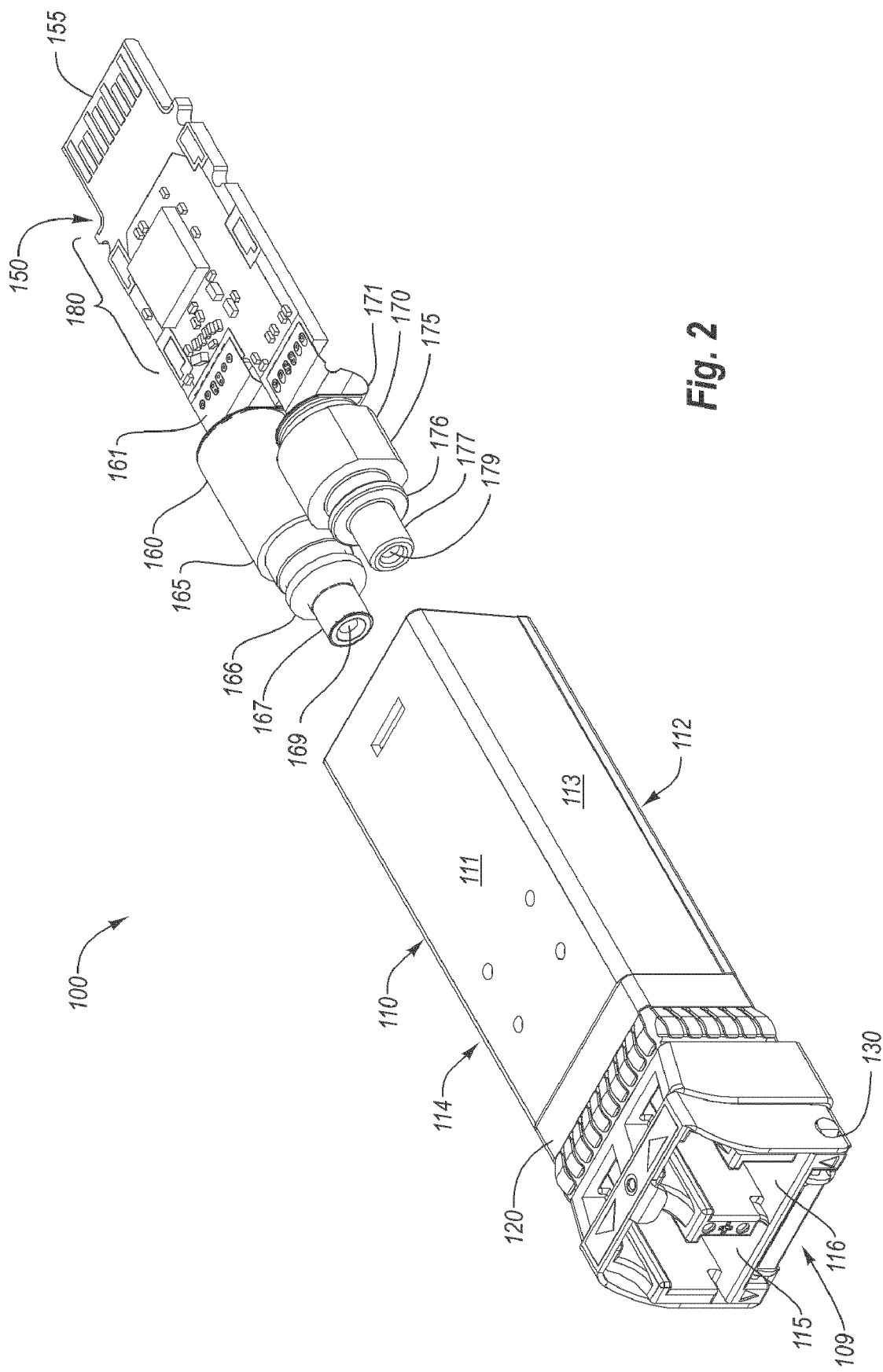
FIG. 2 illustrates various components of the example optoelectronic transceiver module of FIG. 1.

With continuing reference to FIGS. 1 and with reference to FIG. 2, the optoelectronic transceiver module 100 also includes a printed circuit board ("PCB") 150 with various optical transceiver electronics mounted onto the PCB 150. As shown, PCB 150 and its various electronics are configured to be placed inside monolithic, one piece shell 110.

As disclosed in FIG. 2, the PCB 150 includes a transmitter optical subassembly ("TOSA") 160, a receiver optical subassembly ("ROSA") 170, electrical interfaces 161 and 171, and an edge connector 155. The two electrical interfaces 161 and 171 are used to electrically connect the TOSA 160 and the ROSA 170, respectively, to the PCB 150.

The TOSA 160 of the optoelectronic transceiver module 100 includes a barrel 165 within which an optical transmitter, such as a laser, (not shown) is disposed. The optical transmitter is configured to convert electrical signals received through the PCB 150 from a host device (not shown) into corresponding optical signals. The TOSA 160 also includes a flange 166 and a nose piece 167. The nose piece 167 defines a port 169. The port 169 is configured to optically connect the optical transmitter disposed within the barrel 165 with a fiber-ferrule (not shown) disposed within the output port 115.

Similarly, the ROSA 170 of the optoelectronic transceiver module 100 includes a barrel 175, a flange 176, and a nose piece 177. The nose piece 177 defines a port 179. The port 179 is configured to optically connect an optical receiver, such as a photodiode (not shown), disposed within the barrel 175 to a fiber-ferrule (not shown) disposed within the input port 116. The optical receiver is configured to convert optical signals received from the fiber-ferrule into corresponding electrical signals for transmission to a host device (not shown) through the PCB 150.

As further disclosed in FIG. 2, the PCB 150 includes optical transceiver electronics 180. Such electronics may include, but is not limited to, a controller, a laser driver, and a post-amplifier, each of which is configured to help allow optoelectronic transceiver module 100 to convert optical signals into electrical signals and to convert electric signals into optical signals.

Aspects of a Monolithic, One Piece Shell

Figure 3A:
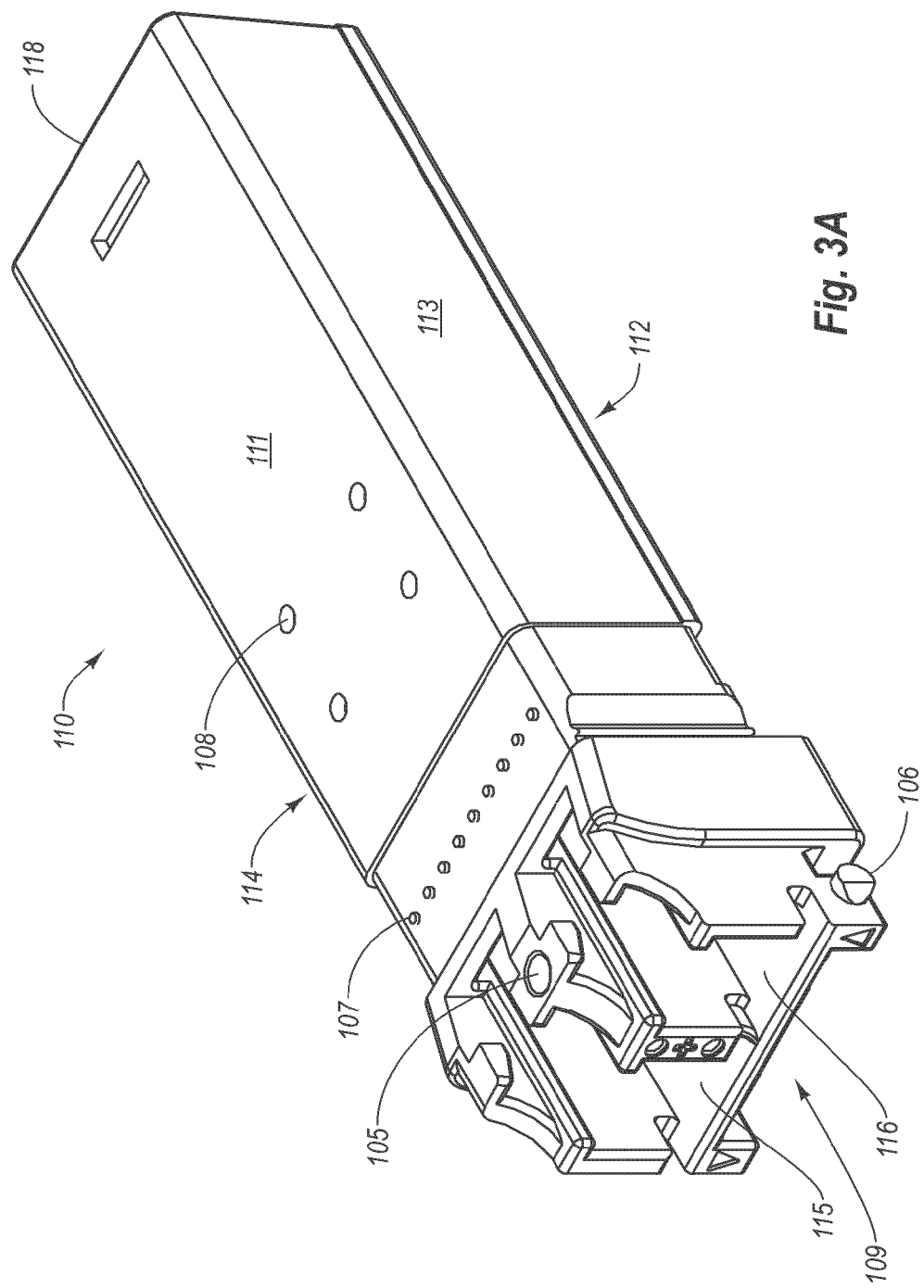

Referring now to FIGS. 3A-3G, various different views of monolithic, one piece shell 110 are illustrated. Referring first to FIG. 3A, an isometric view of monolithic, one piece shell 110 is shown. As is illustrated and as mentioned above, monolithic, one piece shell 110 includes front portion 109 and side portions 111, 112, 113, and 114 as well as a rear portion 118. As mentioned, monolithic, one piece shell 110 is a one piece shell that does not include a separable top and bottom portion as is common in conventional optoelectronic transceiver module shells.

FIG. 3A further illustrates that monolithic, one piece shell 110 includes various holes or openings 108. In some embodiments, these holes allow for thermal paste or the like to be injected into the shell 110 to provide heat sinking when transceiver PCB 150 is inserted into the shell 110.

Figure 3C:
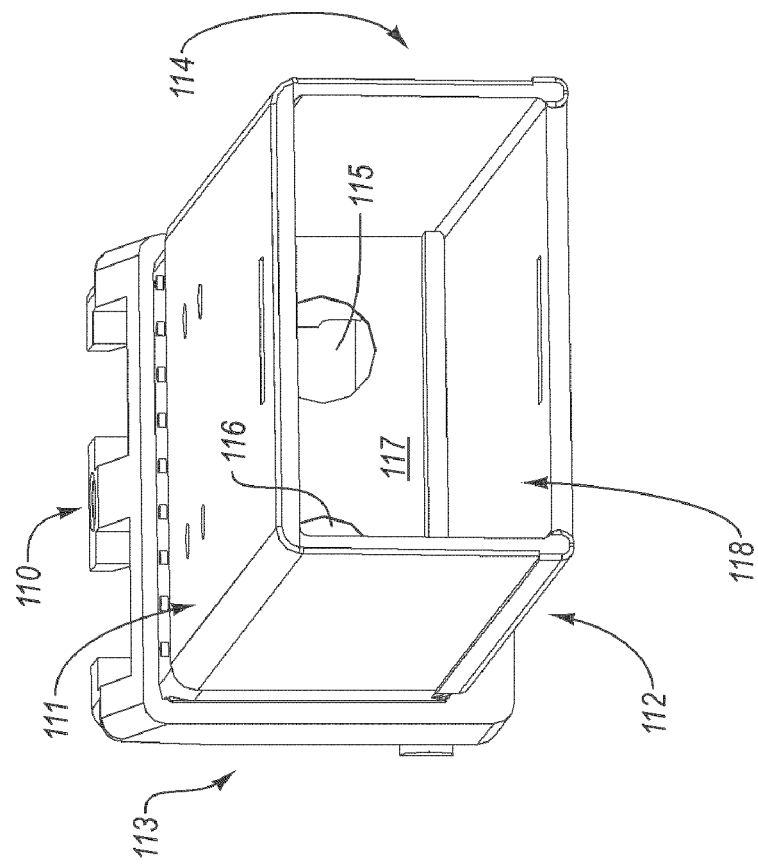
Figure 3B:
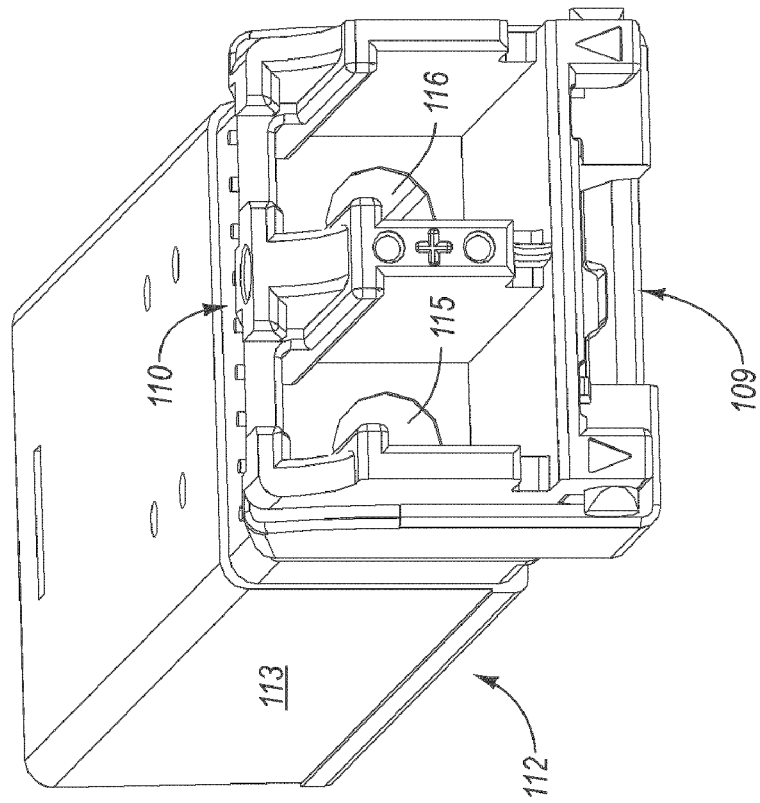
Figure 3D:
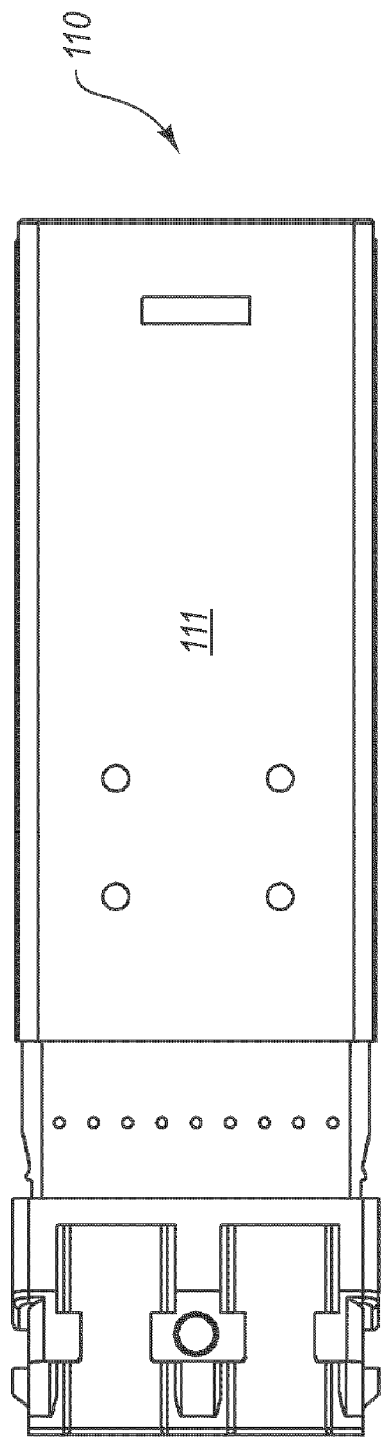
Figure 3E:
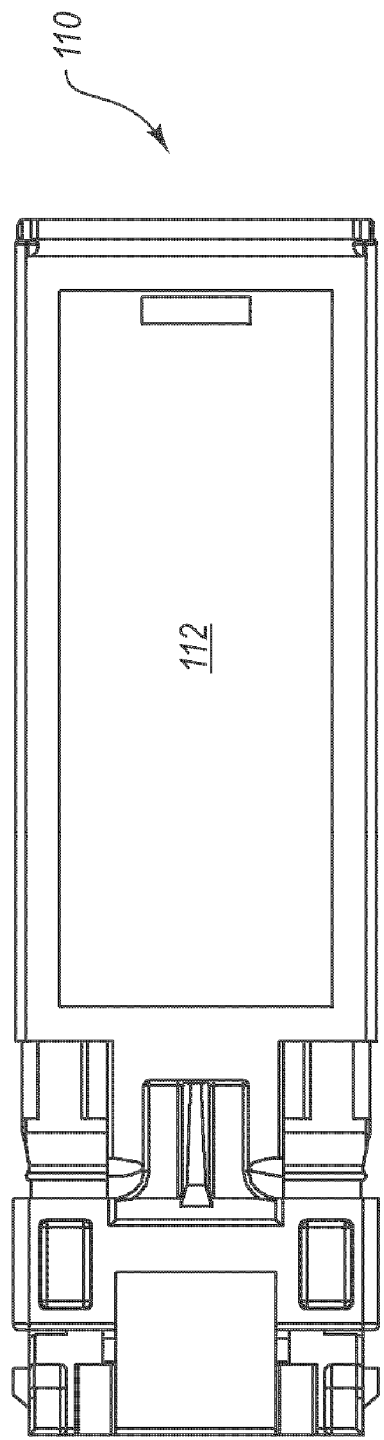

FIG. 3B illustrates a front view of monolithic, one piece shell 110. As can be seen, optical ports 115 and 116 are defined in monolithic, one piece shell 110, specifically by front portion 109. Advantageously, optical ports 115 and 116 are typically the only apertures in monolithic, one piece shell 110 when optical transceiver 100 is disposed within a host device, thus greatly reducing any EMI leakage from module 100.

FIG. 3C illustrates a back view of monolithic, one piece shell 110. As can bee seen, portions 109, 111, 112, 113, and 114 define a cavity 117 where PCB 150 and the electronics mounted thereon may be placed. Note that FIG. 3C illustrates that monolithic, one piece shell 110 is generally a seamless design as it is one piece. As previously mentioned, not having any seams created by the mating of separable top and bottom portions allows monolithic, one piece shell 110 to substantially self-contain any EMI that is generated by optoelectronic transceiver module 100. In other words, there are few or no extraneous apertures where EMI may leak from monolithic, one piece shell 110. In addition, monolithic, one piece shell 110 integrates EMI shielding, optical cable locking features, main housing, and latch features into the one piece design. These elements are typically separate components on conventional transceiver modules. Further, monolithic, one piece shell 110 eliminates the need for separate EMI gaskets or other dispensed materials.

Note that FIG. 3C shows an end portion 118 that is open. In some embodiments, end portion 118 may be sealed by various methods known in the art such as die cast, machined, or plastic plugs or end caps. In still other embodiments, end portion 118 may be configured to receive a PCB carrier or like device as will be explained in more detail to follow.

FIGS. 3D-3G show a top, bottom, right, and left view of monolithic, one piece shell 110. These figures further illustrate the one piece nature of the present embodiments of monolithic, one piece shell 110.

As will be appreciated after reading this description, implementing shell 110 as a monolithic, one piece design creates several advantages over conventional optoelectronic transceiver module shells. For example, as has previously been discussed, having a one piece design significantly reduces any EMI that is leaked by optoelectronic transceiver module 100 as the number of seams and other apertures in monolithic, one piece shell 110 are significantly reduced or eliminated. In addition, the one piece design is compatible with snap fit designs as no fasteners or adhesives are required. The one piece design minimizes the number of piece parts that must be implemented for the shell. This in turn reduces material costs, module weight, and production time and costs. As an additional advantage, the one piece design is a re-workable design that reduces scrap costs as less material is used in production.

Example Embodiment Implementing a Monolithic, One Piece Shell

Figure 4A:
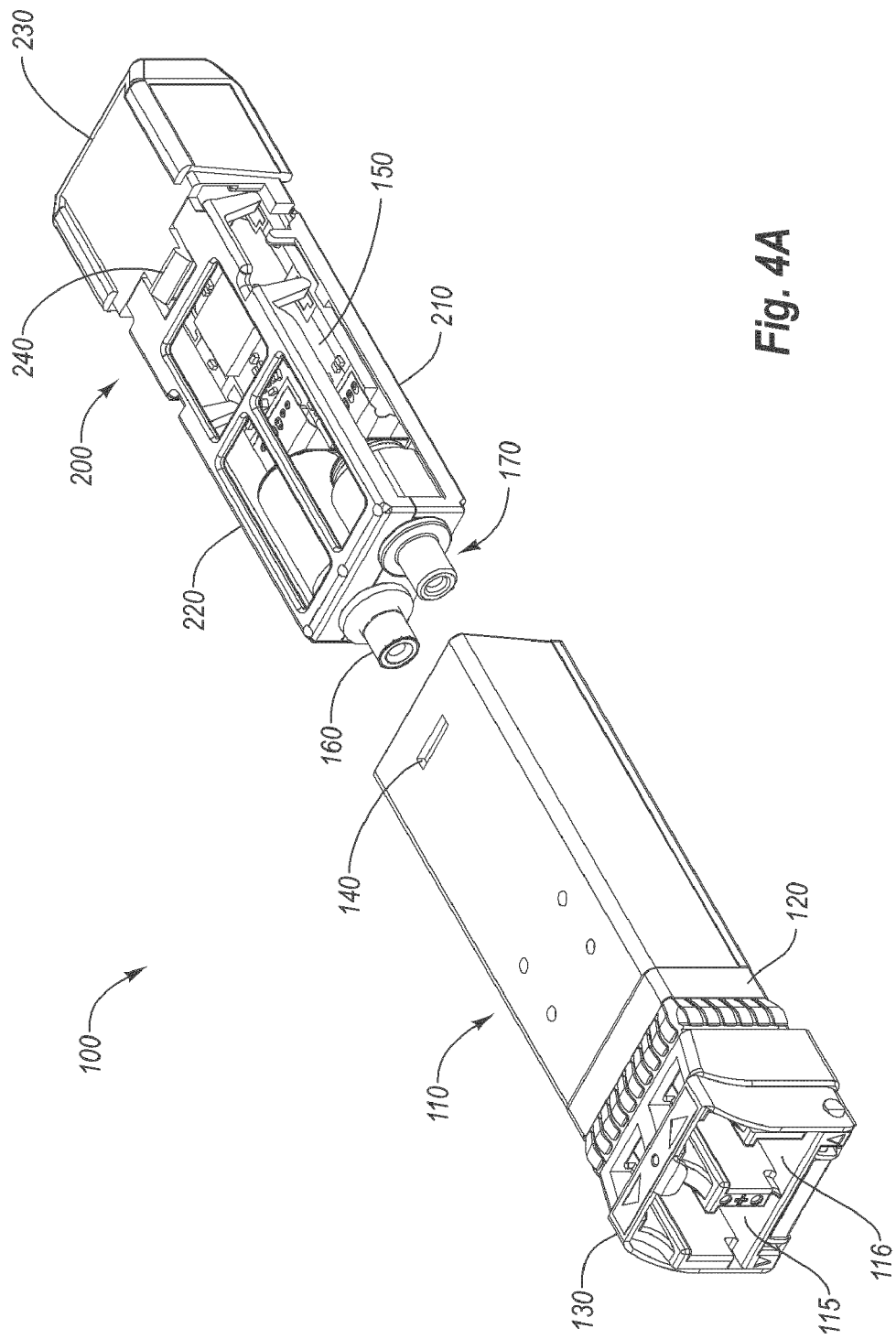
FIGS. 4A-4C illustrate an embodiment of the present invention that implements a monolithic one piece optical transceiver shell and a PCB carrier.
Figure 4B:
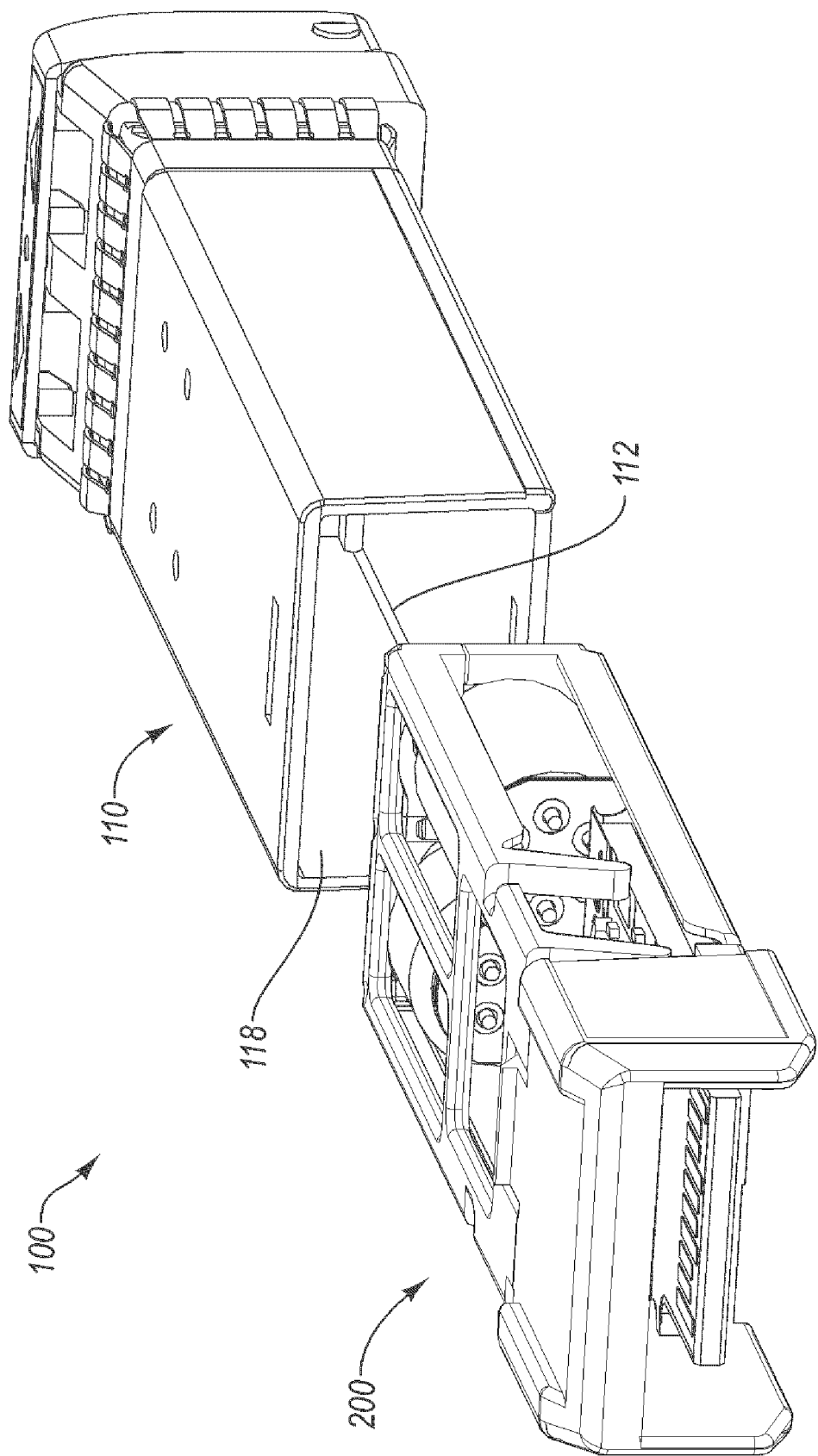
Figure 4C:
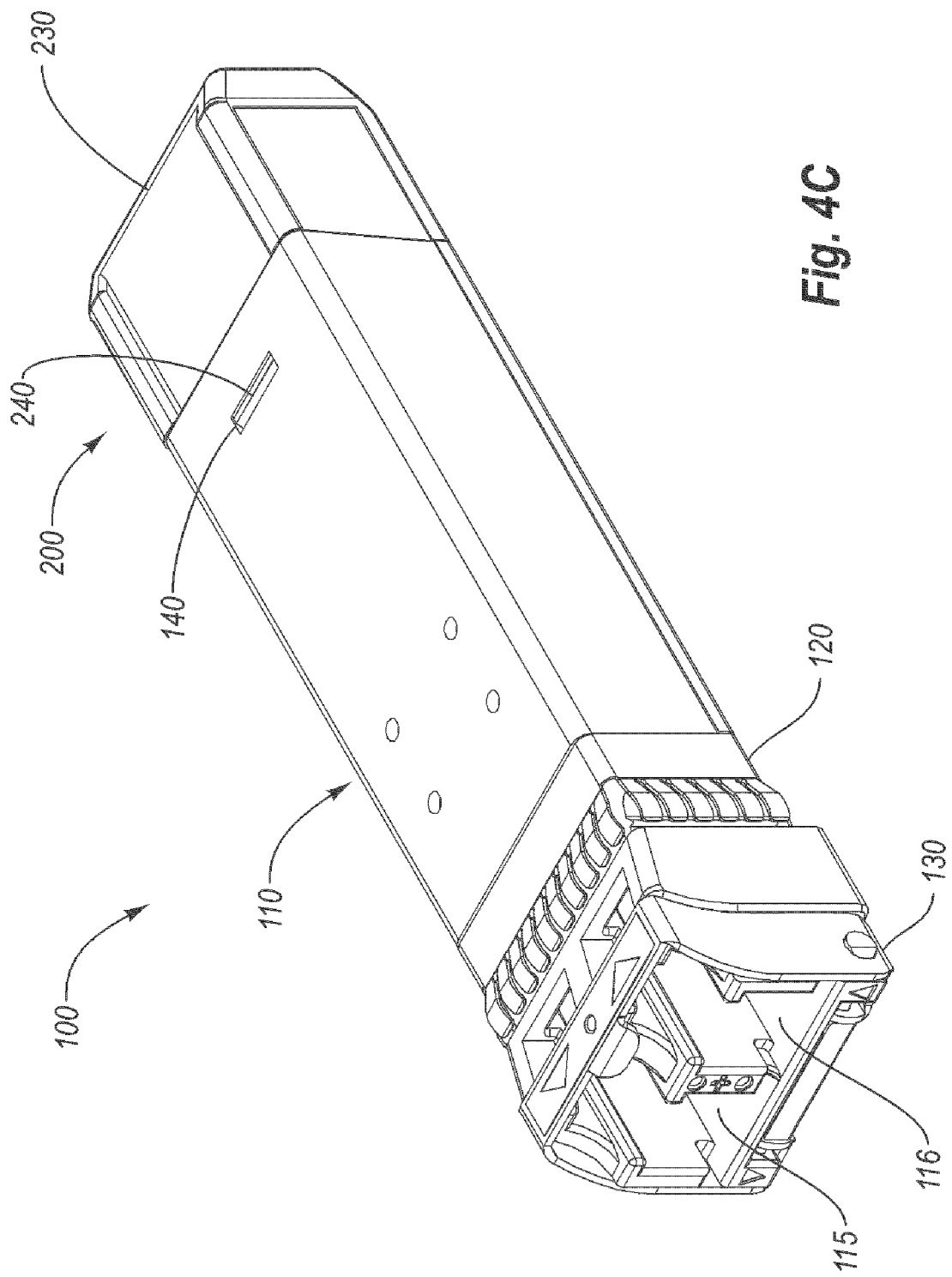

Reference is now made to FIGS. 4A-4C, which illustrate a specific embodiment of an optoelectronic transceiver module 100 that implements a monolithic, one piece shell. As illustrated, FIG. 4A includes a monolithic, one piece shell 110 as previously described. FIG. 4A also shows a PCB carrier 200 that may be used with monolithic, one piece shell 110.

As shown, PCB carrier 200 includes a bottom portion 210, a top portion 220, and an end portion 230. Note that end portion 230 includes a clip 240 that is configured to help secure PCB carrier 200 with monolithic, one piece shell 110. In one embodiment, PCB carrier 200 may be made of plastic, although other suitable materials may also be used. PCB carrier is configured to enclose PCB 150 and the transceiver electronics, TOSA, and ROSA implemented thereon.

In one embodiment, PCB 150 is placed onto bottom portion 210. Top portion 220 is then rotated into place on top of PCB 150, while end portion 230 also rotates into place as illustrated. Additional details of embodiments of a PCB carrier are further described in commonly owned, co-pending U.S. patent application Ser. No. 12/245,976, filed Oct. 6, 2008, which is herein incorporated by reference in its entirety.

Referring now to FIG. 4B, it is illustrated that PCB carrier 200 may be placed into cavity 117 of the monolithic, one piece shell 110 through rear portion 118. Since PCB carrier 200 holds the PCB 150 and the transceiver electronics thereon, monolithic, one piece shell 110 need not include any parts, components, or elements for securing or aligning PCB 150, thus allowing the advantages previously discussed. Of course, it will be appreciated that the advantages previously discussed may still be achieved with designs of monolithic, one piece shell 110 that do include other parts, components, or elements for securing or aligning PCB 150.

FIG. 4C illustrates optoelectronic transceiver module 100 with PCB carrier 200 implemented inside monolithic, one piece shell 110. As can be seen, clip 240 mates with an opening 140 of the shell 110 to secure PCB carrier 200 inside monolithic, one piece shell 110. In addition, end portion 230 of PCB carrier 200 becomes the end portion 118 of monolithic, one piece shell 110 to complete the overall package dimensions. It should be noted that although not illustrated, monolithic, one piece shell 110 may include multiple openings 140. Likewise, PCB carrier 200 may include multiple clips 240 that are configured to mate with the openings 140. In such embodiments, including more than one opening 140 and clip 240 will enable PCB carrier 200 to be more securely placed inside monolithic, one piece shell 110.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optoelectronic transceiver module comprising:
a monolithic, one-piece module shell comprising:
   a top portion;
   a bottom portion;
   a first side portion;
   a second side portion; and
   a front portion;
   wherein the top portion, bottom portion, first side portion, second side portion and the front portion define a cavity configured to enclose electro-optical circuitry;
   wherein the top portion and the bottom portion are configured such that the top portion is not separable from the bottom portion;
   wherein the front portion defines at least one of an optical transmit port or an optical receive port; and
   wherein the monolithic, one-piece module shell does not include one or more seams at the junctions of the top portion, bottom portion, first side portion, and second side portion such that any EMI produced by the electro-optical circuitry is substantially contained within the monolithic, one-piece module shell.

2. The optoelectronic transceiver module in accordance with claim 1, wherein the monolithic, one-piece module shell is configured to receive a printed circuit board that includes the electro-optical circuitry.

3. The optoelectronic transceiver module in accordance with claim 1, wherein the front portion of the monolithic, one-piece module shell defines both an optical transmit port and an optical receive port.

4. The optoelectronic transceiver module in accordance with claim 1, wherein the optoelectronic transceiver module further comprises a latching mechanism attached to the monolithic, one-piece module shell and configured to secure the module within the cage of the host device.

5. The optoelectronic transceiver module in accordance with claim 1, wherein the optoelectronic transceiver module further comprises an EMI collar attached to the monolithic, one-piece module shell and configured to reduce EMI when the module is plugged into the cage of the host device.

6. The optoelectronic transceiver module in accordance with claim 1, wherein the monolithic, one-piece module shell is a die-cast monolithic, one-piece module shell.

7. The optoelectronic transceiver module in accordance with claim 1, wherein the monolithic, one-piece module shell is comprised of one of zinc, aluminum, or magnesium.

8. The optoelectronic transceiver module in accordance with claim 1, wherein the optoelectronic transceiver module is configured for optical signal transmission and reception of one or more per-second data rates including 1 Gbit, 2 Gbit, 2.5 Gbit, 4 Gbit, 8 Gbit, 10 Gbit, or data rates higher than 10 Gbit.

9. The optoelectronic transceiver module in accordance with claim 1, wherein the optoelectronic transceiver module is configured for optical signal transmission and reception at one or more wavelengths including 850 nm, 1310 nm, 1470 nm, 1490 nm, 1510 nm, 1530 nm, 1550 nm, 1570 nm, 1590 nm, or 1610 nm.

10. The optoelectronic transceiver module in accordance with claim 1, wherein the optoelectronic transceiver module is configured to support one or more transmission standards including Fast Ethernet, Gigabit Ethernet, 10 Gigabit Ethernet, and 1×, 2×, 4×, and 10× Fibre Channel.

11. The optoelectronic transceiver module in accordance with claim 1, wherein the optoelectronic transceiver module is configured to have a form factor that is substantially compliant with one of the SFP+ (IPF) MSA, the SFF MSA, the XENPAK MSA, the X2 MSA, or the SFP MSA.

12. The optoelectronic transceiver module in accordance with claim 1, wherein the enclosed electro-optical circuitry includes one of a TOSA or a ROSA.

13. The optoelectronic transceiver module in accordance with claim 1, wherein the monolithic, one-piece module shell further includes a back portion that is at least partially sealed to prevent EMI leakage from the electro-optical circuitry.

14. An optoelectronic transceiver module comprising:
a monolithic, one-piece module shell comprising:
   a top portion;
   a bottom portion;
   a first side portion;
   a second side portion; and
   a front portion; wherein the top portion, bottom portion, first side portion, second side portion and the front portion define a cavity and wherein the monolithic, one-piece module shell does not include one or more seams; and
a printed circuit board (PCB) carrier configured to be placed in the cavity of the monolithic, one-piece module shell, wherein the PCB carrier is configured to enclose a PCB having one or more optoelectronic circuits placed thereon.

15. The optoelectronic transceiver module in accordance with claim 14, wherein the PCB carrier includes one or more clips configured to mate with one or more openings of the monolithic, one-piece module shell in order to secure the PCB carrier to the monolithic, one-piece module shell.

16. The optoelectronic transceiver module in accordance with claim 14, wherein an end portion of the PCB carrier acts as a plug for the monolithic, one-piece module shell.

17. The optoelectronic transceiver module in accordance with claim 14, wherein the end portion of the PCB carrier includes an opening comprising an electrical interface for interfacing with a host device.

18. The optoelectronic transceiver module in accordance with claim 14, wherein the monolithic, one-piece module shell does not include any parts, components, or elements for aligning the PCB received by the PCB carrier.

* * * * *